(12) United States Patent
Tsumoto et al.

(10) Patent No.: US 6,713,136 B2
(45) Date of Patent: Mar. 30, 2004

(54) PELLICLE

(75) Inventors: Takamasa Tsumoto, Kuga-gun (JP);
Hiroyuki Kurata, Kuga-gun (JP);
Hiroaki Nakagawa, Kuga-gun (JP);
Minoru Fujita, Kuga-gun (JP)

(73) Assignee: Mitsui Chemicals, Inc., Tokyo (JP)

( * ) Notice: Subject to any disclaimer, the term of this patent is extended or adjusted under 35 U.S.C. 154(b) by 68 days.

(21) Appl. No.: 10/025,562

(22) Filed: Dec. 26, 2001

(65) Prior Publication Data

US 2002/0136965 A1 Sep. 26, 2002

(30) Foreign Application Priority Data

Dec. 27, 2000  (JP) ......................................... 2000-399447

(51) Int. Cl.⁷ .................................................. B32B 3/02
(52) U.S. Cl. ........................ 428/14; 428/217; 428/214; 430/5
(58) Field of Search ........................ 428/14, 217, 214; 430/5

(56) References Cited

U.S. PATENT DOCUMENTS 5,723,860 A * 3/1998 Hamada et al. ............. 250/239

* cited by examiner

*Primary Examiner*—Alexander S. Thomas
(74) *Attorney, Agent, or Firm*—Burns, Doane, Swecker & Mathis, LLP

(57) ABSTRACT

A pellicle comprising a pellicle film, a pellicle frame supporting the pellicle film, and an adhesive resin layer provided on the surface of the pellicle frame on the side opposite to the surface supporting the pellicle film, wherein the adhesive resin layer is formed of a combination of a hard resin layer and a soft resin layer. The pellicle can be mounted on the mask and can be removed from the mask without giving damage to the mask, and does not spoil the flatness of the mask irrespective of when the mask surface is maintained in either the horizontal direction or the vertical direction.

9 Claims, 2 Drawing Sheets

PELLICLE

BACKGROUND OF THE INVENTION

1. Field of the Invention

The present invention relates to a pellicle used in a step of photolithography in the production of integrated circuits for the purpose of preventing dust and dirt from adhering onto the mask or the reticle (hereinafter simply referred to as mask and the like). More specifically, the invention relates to a pellicle of which an adhesive resin layer for mounting the pellicle on the mask is formed of a hard resin layer and a soft resin layer.

2. Description of the Prior Art

In the above-mentioned pellicle, in general, a transparent pellicle film of a nitrocellulose or the like is stretched, via an adhesive layer, on an end of a pellicle frame made of aluminum or the like, and the other end of the pellicle frame is adhered with an adhesive (mask-adhering) layer onto the pattern-forming surface of the mask or the like, so that the pellicle will not be removed from the mask or the like during the handling.

When the mask-adhering agent exhibits a too strong adhering force, therefore, the mask is damaged due to the application of an excessive force at the time of peeling the pellicle off the mask and the like or the mask-adhering agent remains on the mask after it has been peeled off. As a result, the semiconductor devices could become defective or the yield of production decreases.

From such a point of view, there have been proposed a pellicle with a mask-adhering agent exhibiting a weaker adhering force to the mask than to the pellicle (Japanese Unexamined Patent Publication (Kokai) No. 75835/1985), and a pellicle using a mask-adhering agent having a hardness of not larger than 200 gf (Japanese Unexamined Patent Publication (Kokai) No. 282640/1998).

Despite the mask-adhering layer formed between the mask and the pellicle frame has an adhering force as taught in the above prior art (Japanese Unexamined Patent Publication (Kokai) No. 75835/1985), however, the mask is distorted and loses flatness. That is, when the mask loses flatness, the pattern formed on the mask is distorted, and a correct pattern is not transferred onto the wafer.

In the step of photolithography, furthermore, exposure to light is effected not only where flat surfaces of the mask and of the pellicle film are maintained in a horizontal direction but also where flat surfaces of the mask and of the pellicle film are maintained in a vertical direction. When the surface of the mask is maintained in the vertical direction, however, the layer of the mask-adhering layer hangs down due to its own weight in the case of the mask-adhering agent taught in the above Japanese Unexamined Patent Publication (Kokai) No. 282640/1998 spoiling the flatness of the mask.

SUMMARY OF THE INVENTION

It is therefore an object of the present invention to provide a pellicle which gives no damage to the mask, which can be mounted on, and removed from, the mask, and which does not lose flatness of the mask even when the mask surface is maintained in either the horizontal direction or the vertical direction.

According to the present invention, there is provided a pellicle comprising a pellicle film, a pellicle frame supporting the pellicle film, and an adhesive resin layer provided on the surface of the pellicle frame on the side opposite to the surface supporting the pellicle film, wherein the adhesive resin layer is formed of a combination of a hard resin layer and a soft resin layer.

In the pellicle of the present invention, it is desired that:
1. The hard resin has a hardness (JIS A) of not smaller than 170 gf and the soft resin has a hardness (JIS A) of not larger than 100 gf; and
2. The soft resin layer is formed maintaining a thickness larger than that of the hard resin layer.

Further, the adhesive resin layer has such a layer structure that the soft resin layer is located on the side of the pellicle frame and the hard resin layer is located on the soft resin layer. With this layer structure, the pellicle is mounted on the mask via the hard resin layer. In this adhesive resin layer, it is desired that the hard resin layer has a thickness which is from 5 to 30% of the thickness of the adhesive resin layer, and the soft resin layer has a thickness which is from 95 to 70% of the thickness of the adhesive resin layer. Further, the soft resin layer can be sandwiched between the two hard resin layers. In this case, the hard resin layer comes in contact with both the pellicle frame and the mask.

Further, the adhesive resin layer can have such a layer structure that both the soft resin layer and the hard resin layer come in contact with the pellicle frame. With this layer structure, both the soft resin layer and the hard resin layer come in contact with the mask that is mounted. In this adhesive resin layer, it is desired that the hard resin layer is disposed on the lower side of the soft resin layer. There can be further employed such a layer structure that the soft resin layer is disposed between the two hard resin layers. It is further desired that the width of contact between the hard resin layer and the mask that is mounted, is from 10 to 30% of the width of contact between the adhesive resin layer and the mask that is mounted.

DETAILED DESCRIPTION OF THE INVENTION

Figure 1:
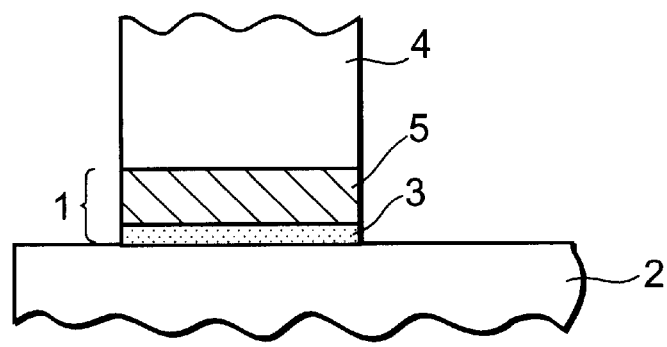
FIGS. 1 to 4 are sectional views illustrating layer structures of the adhesive resin layer in the pellicle of the present invention.

In studying a mask mounting a pellicle, the present inventors have discovered the fact that the hardness of the adhesive resin layer for securing the pellicle frame to the mask plays an important role for maintaining the flatness of the mask. It is desired that the adhesive resin layer (hereinafter often called mask-adhering layer) exhibits a suitable adhering force on the interface to the mask.

When, for example, the mask-adhering layer between the mask and the pellicle frame is formed of a hard resin, the mask and the mask-adhering layer are secured together. Here, when the interface is flat between the pellicle frame and the mask-adhering layer (hard resin), the mask maintains flatness. When the interface has a wide area, however, it becomes difficult to maintain the whole interface completely flat; i.e., the mask is distorted tracing the mask-adhering layer (hard resin) and loses flatness. When the mask-adhering layer which is hard is mounted on the mask, a gap is formed between the mask-adhering layer and the mask or the pellicle frame, permitting dust and dirt to enter.

On the other hand, the mask-adhering layer that is formed of a soft resin absorbs the load of the mask and of the pellicle frame imparting such an adhering force that permits peeling from the mask and the pellicle frame. Such a mask-adhering layer (soft resin), however, is subject to be deformed. When the pellicle is maintained in the vertical direction, in particular, the layer of the mask-adhering layer hangs down due to its own weight. If there occurs an interfacial peeling, therefore, the mask-adhering layer deviates down. Besides, if the mask-adhering layer is deformed or deviated downward, undesired stress acts upon the mask, whereby the mask is distorted to spoil the flatness of the mask.

From the above point of view, therefore, the mask-adhering layer according to the present invention is formed of a hard resin layer and a soft resin layer, so that the mask-adhering layer (adhesive resin layer) interposed between the pellicle frame and the mask will not affect the mask even when the mask mounting the pellicle is placed in a horizontal state or in a vertical state.

That is, according to the present invention, the mask needs softly trace the hard resin layer owing to the soft resin layer yet the deformation of the soft resin layer due to its own weight is suppressed by the hard resin layer. In particular, deviation of the pellicle of when it is maintained in the vertical direction is suppressed by the hard resin layer, minimizing the effect of the mask-adhering layer upon the mask, preventing the mask from losing flatness.

Flatness of the mask is expressed by a displacement ($\mu$m) of a z-axis perpendicular to an XY-plane of the mask defined by an X-axis and a Y-axis. The value becomes 0 when the mask is completely flat. In general, a range of flatness of the mask that does not impose a problem in practice is about 2 $\mu$m in average in a region surrounded by a square pellicle having a side of 5 inches, and is about 5 $\mu$m in average in a region surrounded by a square pellicle having a side of 6 inches. Use of the pellicle of the present invention makes it possible to obtain flatness satisfying the above values.

In the present invention, it is desired that the hard resin has a hardness of not smaller than 170 gf and, particularly, in a range of from 200 to 240 gf and that the soft resin has a hardness of not larger than 100 gf and, particularly, in a range of from 40 to 80 gf. The hardness can be measured by using a rubber hardness meter GS-70 (JIA A TYPE). Upon having hardnesses lying within the above-mentioned range, the hard resin layer effectively suppresses the soft resin layer from being deformed while the soft resin layer exhibits a preferred adhering strength, thereby to effectively relax the effect of the hard resin layer upon the mask or the pellicle.

In the pellicle of the present invention, the adhesive resin layer (mask-adhering layer) has a structure as shown in FIGS. 1 to 4, wherein reference numeral 1 denotes an adhesive resin layer (mask-adhering layer), 2 denotes a mask, 3 denotes a hard resin layer, 4 denotes a pellicle frame and reference numeral 5 denotes a soft resin layer.

In the layer structure of FIG. 1, the hard resin layer 3 in the mask-adhering layer 1 is disposed on the side of the mask 2, and the soft resin layer 5 in the mask-adhering layer 1 is disposed on the side of the pellicle frame 4. As will be obvious from FIG. 1, further, the hard resin layer 3 has a small thickness and the soft resin layer 5 has a large thickness.

Figure 2:
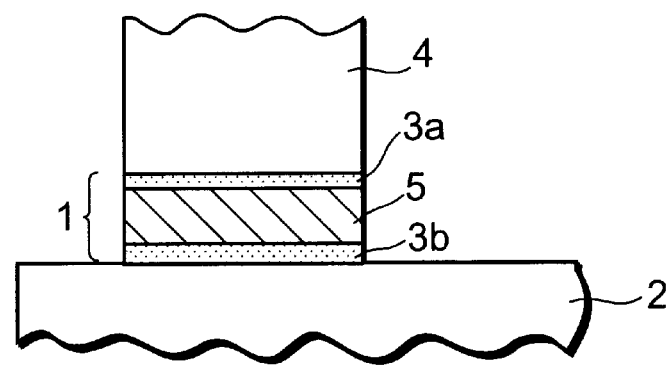

In the layer structure shown in FIG. 2, the mask-adhering layer 1 includes a soft resin layer 5 and two hard resin layers 3a, 3b, the soft resin layer 5 being sandwiched between the two hard resin layers 3a and 3b. Further, one (3a) of the two hard resin layers 3a, 3b is in contact with the pellicle frame 4 and the other one (3b) is in contact with the mask 2. Like in FIG. 1, further, the hard resin layers 3a and 3b have small thicknesses and the soft resin layer 5 has a large thickness.

In the above-mentioned layer structures of FIGS. 1 and 2, it is desired that the surface of the mask 2 is maintained in a horizontal direction.

Figure 3:
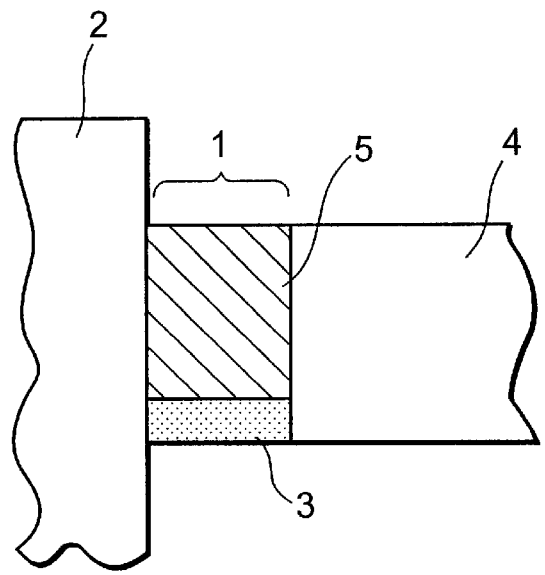
Figure 4:
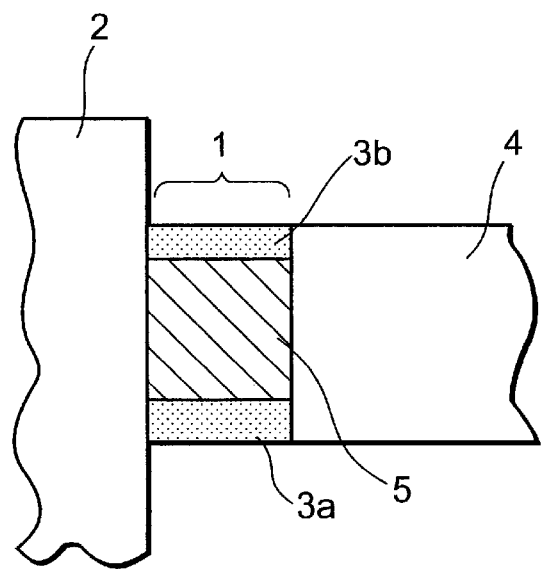

The layer structures shown in FIGS. 3 and 4 are desired when the surface of the mask 2 (surface of the pellicle film) is maintained in the vertical direction. In these examples, both the hard resin layer 3 (3a, 3b) and the soft resin layer 5 are in contact with the pellicle frame 4 and with the mask 2. In the example of FIG. 3, the mask-adhering layer 1 is formed by one hard resin layer 3 and one soft resin layer 5. In the example of FIG. 4, the soft resin layer 5 is sandwiched between the two hard resin layers 3a and 3b. In these examples, too, the hard resin layer 3 (3a, 3b) has a small thickness and the soft resin layer 5 has a large thickness.

In the embodiments of FIGS. 3 and 4, it is desired that a thin layer 3 of a hard resin is provided at least under the thick layer 5 of the soft resin. That is, when the pellicle is maintained in the vertical direction, the hard resin layer 3 is positioned at least under the soft resin layer 5 in order to suppress the deformation or downward deviation of the soft resin layer 5 due to its own weight by utilizing the hard resin layer.

In the present invention, further, it is allowable to change the layer structure of the adhesive resin layer (mask-adhering layer) depending upon the position of the pellicle frame, as a matter of course. When the exposure to light is effected with the mask and pellicle being maintained, for example, in the vertical state, the mask-adhering layer formed on the end surface of a portion of the pellicle frame extending in the horizontal direction may have a layer structure as shown in FIG. 3 or 4, and the mask-adhering layer formed on the end surface of a portion of the pellicle frame extending in the vertical direction may have a layer structure as shown in FIG. 1 or 2.

In the pellicle of the present invention, e.g., in the embodiments shown in FIGS. 1 and 2, it is desired that the mask-adhering layer 1 itself has a thickness of usually from about 200 microns ($\mu$m) to about 2000 microns ($\mu$m) and in which the hard resin layer 3 has a thickness in a range of from 5 to 30% and, particularly, from 5 to 25% and the soft resin layer 5 has a thickness in a range of from 95 to 70% and, particularly, from 95 to 75%.

In the embodiments shown in FIGS. 3 and 4, the width (corresponding to the width of adhesion) for providing the mask-adhering layer 1 is usually from 1200 $\mu$m to 5000 $\mu$m. It is also allowable to change the ratio of the width (adhering width) of the hard resin layer 3 and the width (adhering width) of the soft resin layer 5. Here, however, it is desired that the width of the hard resin layer 3 is from 10 to 30% of the whole width (mask-adhering layer 1) and the width of the soft resin layer 5 is from 90 to 70% of the whole width.

When the mask surface is maintained in the vertical direction with the pellicle being mounted thereon, the embodiment of FIG. 3 is desired. In this case, the thin layer 3 of the hard resin exhibits an enhanced effect when it is formed on the lower side so as to support the pellicle. In the process of the pellicle, however, it is difficult to form the mask-adhering layer 1 so that the hard resin layer 3 is positioned on the lower side of the soft resin layer 5 in both of the upper side of the frame 5 and the lower side of the frame 5. Therefore, the thin layer 3 of the hard resin may be provided on the side of a space defined by the pellicle and the mask and on the outside of the thick layer 5 of the soft resin. In this case, it is desired that the thickness of the layer of the hard resin is from 10 to 30% of the whole thickness of the mask-adhering layer, and the layer of the soft resin is from 90 to 70% of the whole thickness of the mask-adhering layer.

When the ratios of the thickness and the width of the hard resin layer become greater than the above-mentioned ranges, the distortion of the mask or of the pellicle frame caused by the hard resin layer is relaxed by the soft resin layer to a decreased extent. As a result, the strength becomes irregular.

Conversely, when the ratios of the thickness and the width of the hard resin layer become smaller than the above-mentioned ranges, the distortion of the soft resin layer due to the weights of the mask and the pellicle is not suppressed to a sufficient degree by the hard resin layer.

(Hard Resin)

Though there is no particular limitation, the hard resin used in the present invention is an adhesive agent such as acrylic, rubber, polybutene or polyurethane, which can be used alone or in a combination of two or more kinds.

It is desired that the hard resin exhibits an adhering force of from 50 to 700 g/cm and, particularly, from 220 to 700 g/cm as measured in compliance with the adhering force testing method stipulated under JIS Z-0237.

(Soft Resin)

Though there is no particular limitation, the soft resin used in the present invention is an adhesive agent such as acrylic, rubber, polybutene or polyurethane, which can be used alone or in a combination of two or more kinds. It is desired that the soft resin exhibits an adhering force of from 100 to 1200 g/cm and, particularly, from 350 to 600 g/cm as measured in compliance with the adhering force testing method stipulated under JIS Z-0237.

The hardnesses and adhering forces of the adhesive agents used as the hard resin and the soft resin for forming the mask-adhering layer, can be adjusted to desired values by adjusting the molecular weights of resins, amounts of functional groups and compositions thereof.

(Formation of the Mask-Adhering Layer)

In the present invention, the mask-adhering layer can be formed by directly applying the soft resin and the hard resin as mask-adhering agents onto the pellicle frame. Referring, for example, to FIGS. 1 and 2, the mask-adhering layer is laminated in parallel with the end surface of the pellicle frame by successively applying the resins. Referring, further, to FIG. 3 and 4, the mask-adhering layer is laminated vertically to the end surface of the pellicle frame by simultaneously or separately applying the resins thereon. The resins can be applied by any known application means, such as spray-application method, brush-application method, roller-coating method, or spread-application method. When the spray-application method is employed, the liquid droplets put on the frame are drawn by using a jig and is evenly applied thereon followed by drying to thereby form the mask-adhering layer.

(Pellicle Frame)

Any widely known pellicle frame can be used. Though not limited thereto only, the pellicle frame may be made of a metal such as aluminum, aluminum alloy or stainless steel, or may be made of a synthetic resin or ceramics.

In the pellicle of the present invention, the weight of the pellicle frame is not larger than 100 g and is, particularly, in a range of from 10 to 30 g from the above-mentioned relationship between the resin layer and the adhering force.

The pellicle of the present invention is such that the pellicle film is stretched on one side of the pellicle frame via the adhesive resin layer, and the adhesive resin layer (mask-adhering layer) comprising the hard resin and the soft resin is provided on the other side so as to be mounted on the mask.

(Pellicle Film)

Any known pellicle film can be used for the pellicle of the present invention. Though not limited thereto only, the pellicle film may be formed of nitrocellulose, cellulose propionate or fluorine-contained material.

EXAMPLES

Examples will now be described. The soft resins and hard resins that are used are hot-melt resins (having melting points of from 180 to 200° C.). Wax, ethylene-vinyl acetate copolymer and resin are adjusted for their compositions, and are used as soft resins and hard resins.

Example 1

A mask-adhering layer was formed on an aluminum frame as shown in FIG. 1 in a manner that the soft resin layer 5 possessed a hardness of from 40 to 100 gf and a thickness of from 75 to 95% and that the hard resin layer 3 possessed a hardness of from 170 to 240 gf and a thickness of from 5 to 25%. There were used two kinds of aluminum frames, the frames of the one kind having a side of 5 inches (outer size of 120×98 and a frame width of 2 mm) and the frames of another kind having a side of 6 inches (outer size of 149×122 and a frame width of 2 mm).

The frame on which the mask-adhering layer was formed as described above was stuck to the mask in a horizontal state with a sticking load of 30 kg for 3 minutes.

The mask in a stuck state was preserved for a month to measure the deformation of the mask-adhering layer and flatness of the mask (Tables 1 and 2).

The frame was then peeled off the mask to measure the peeling property and flatness of the mask after peeling (Tables 1 and 2).

Upon forming the mask-adhering layer on the frame as described above, the flatness of the mask could be maintained after being stuck, and the mask-adhering layer was not deformed. The frame could be easily peeled off since it was mounted on the mask via the hard resin layer, and the flatness could be maintained even after the peeling.

Comparative Example 1

The frame on which the mask-adhering layer was formed under the conditions lying outside the scope of Example 1 was measured in the same manner as in Example 1 [Table 1 (1, 3, 7, 11) and Table 2 (1, 3, 7, 11)]. As a result, problems occurred as shown in Tables 1 and 2.

Example 2

A mask-adhering layer 1 was formed on an aluminum frame to constitute the layer structure as shown in FIG. 1 in a manner that the soft resin layer 5 possessed a hardness of from 40 to 100 gf and a thickness of from 75 to 95% and that the hard resin layers 3a and 3b possessed hardnesses of from 170 to 240 gf and thicknesses of from 5 to 25%. There were used two kinds of aluminum frames, the frames of the one kind having a side of 5 inches (outer size of 120×98 and a frame width of 2 mm) and the frames of another kind having a side of 6 inches (outer size of 149×122 and a frame width of 2 mm).

The frame on which the mask-adhering layer was formed as described above was stuck to the mask in a horizontal state with a sticking load of 30 kg for 3 minutes.

The mask in a stuck state was preserved for a month to measure the deformation of the mask-adhering layer and flatness of the mask (Tables 3 and 4). The frame was then peeled off the mask to measure the peeling property and flatness of the mask after peeling (Tables 3 and 4).

Upon forming the mask-adhering layer on the frame as described above, the flatness of the mask could be maintained after being stuck, and the mask-adhering layer was not deformed. The frame could be easily peeled off since it was mounted on the mask via the mask-adhering layer of a combination of the hard resin layer and the soft resin layer, and the flatness could be maintained even after the peeling.

Comparative Example 2

The frame on which the mask-adhering layer was formed under the conditions lying outside the scope of Example 2 was measured in the same manner as in Example 2 [Table 3 (1, 3, 7, 11) and Table 4 (1, 3, 7, 11)]. As a result, problems occurred as shown in Tables 3 and 4.

Example 3

A mask-adhering layer was formed on an aluminum frame to constitute the layer structure as shown in FIG. 3 in a manner that the soft resin layer 5 possessed a hardness of from 40 to 100 gf and a thickness of from 70 to 90% and that the hard resin layer 3 possessed a hardness of from 170 to 240 gf and a thickness of from 10 to 30%.

There were used two kinds of aluminum frames, the frames of the one kind having a side of 5 inches (outer size of 120×98 and a frame width of 2 mm) and the frames of another kind having a side of 6 inches (outer size of 149×122 and a frame width of 2 mm).

The frame on which the mask-adhering layer was formed as described above was stuck to the mask in a vertical state with a sticking load of 30 kg for 3 minutes.

The mask in a stuck state was preserved for a month to measure the deformation of the mask-adhering layer and flatness of the mask (Tables 5 and 6).

The frame was then peeled off the mask to measure the peeling property and flatness of the mask after peeling (Tables 5 and 6).

Upon forming the mask-adhering layer on the frame as described above, the flatness of the mask could be maintained after being stuck, and the mask-adhering layer was not deformed. The frame could be easily peeled off since it was mounted on the mask via the mask-adhering layer of a combination of the hard resin layer and the soft resin layer, and the flatness could be maintained even after the peeling.

Comparative Example 3

The frame on which the mask-adhering layer was formed under the conditions lying outside the scope of Example 3 was measured in the same manner as in Example 3 [Table 5 (1, 3, 7, 11) and Table 6 (1, 3, 7, 11)]. As a result, problems occurred as shown in Tables 5 and 6.

Example 4

A mask-adhering layer was formed on an aluminum frame to constitute the layer structure as shown in FIG. 4 in a manner that the soft resin layer 5 possessed a hardness of from 40 to 100 gf and a thickness of from 70 to 90% and that the hard resin layers 3a and 3b possessed hardnesses of from 170 to 240 gf and thicknesses of from 10 to 30%. There were used two kinds of aluminum frames, the frames of the one kind having a side of 5 inches (outer size of 120×98 and a frame width of 2 mm) and the frames of another kind having a side of 6 inches (outer size of 149 ×122 and a frame width of 2 mm).

The frame on which the mask-adhering layer was formed as described above was stuck to the mask in a vertical state with a sticking load of 30 kg for 3 minutes.

The mask in a stuck state was preserved for a month to measure the deformation of the mask-adhering layer and flatness of the mask (Tables 7 and 8). The frame was then peeled off the mask to measure the peeling property and flatness of the mask after peeling (Tables 7 and 8).

Upon forming the mask-adhering layer on the frame as described above, the flatness of the mask could be maintained after being stuck, and the mask-adhering layer was not deformed. The frame could be easily peeled off since it was mounted on the mask via the mask-adhering layer of a combination of the hard resin layer and the soft resin layer, and the flatness could be maintained even after the peeling.

Comparative Example 4

The frame on which the mask-adhering layer was formed under the conditions lying outside the scope of Example 4 was measured in the same manner as in Example 4 [Table 7 (1, 3, 7, 11) and Table 8 (1, 3, 7, 11)]. As a result, problems occurred as shown in Tables 7 and 8.

TABLE 1

| | (Frame having a side of 5 inches.) | | | | | | |
|---|---|---|---|---|---|---|---|
| | Hard adhesive layer | | Soft adhesive layer | | One month after stuck | | Overall |
| Condition | Hardness (gf) | Thickness (%) | Hardness (gf) | Thickness (%) | Flatness (μm) | Deformation of adhesive | evaluation |
| ① | 150 | 16 | 60 | 84 | 2.2 | yes | X |
| ② | 170 | 14 | ↓ | 86 | 1.2 | no | ○ |
| ③ | 220 | 31 | ↓ | 69 | 2.4 | no | X |
| ④ | ↓ | 23 | ↓ | 77 | 1.4 | no | ○ |
| ⑤ | ↓ | 15 | ↓ | 85 | 0.8 | no | ○ |
| ⑥ | ↓ | 6 | ↓ | 94 | 1.3 | no | ○ |
| ⑦ | ↓ | 3 | ↓ | 97 | 2.3 | yes | X |
| ⑧ | 240 | 16 | ↓ | 84 | 1.5 | no | ○ |
| ⑨ | 220 | 15 | 40 | 85 | 1.3 | no | ○ |
| ⑩ | ↓ | ↓ | 100 | ↓ | 1.4 | no | ○ |
| ⑪ | ↓ | 17 | 120 | 83 | 2.1 | no | X |

*: Adhesive layer is 500 μm thick

TABLE 2

(Frame having a side of 6 inches.)

| Condition | Hard adhesive layer | | Soft adhesive layer | | One month after stuck | | Overall evaluation |
|---|---|---|---|---|---|---|---|
| | Hardness (gf) | Thickness (%) | Hardness (gf) | Thickness (%) | Flatness (μm) | Deformation of adhesive | |
| ① | 150 | 15 | 60 | 85 | 4.8 | yes | X |
| ② | 170 | 14 | ↓ | 86 | 4.2 | no | ○ |
| ③ | 220 | 33 | ↓ | 67 | 6.2 | no | X |
| ④ | ↓ | 24 | ↓ | 76 | 4.0 | no | ○ |
| ⑤ | ↓ | 14 | ↓ | 86 | 3.2 | no | ○ |
| ⑥ | ↓ | 5 | ↓ | 95 | 3.9 | no | ○ |
| ⑦ | ↓ | 3 | ↓ | 97 | 5.8 | yes | X |
| ⑧ | 240 | 15 | ↓ | 85 | 3.6 | no | ○ |
| ⑨ | 220 | 14 | 40 | 86 | 3.8 | no | ○ |
| ⑩ | ↓ | 17 | 100 | 83 | 4.4 | no | ○ |
| ⑪ | ↓ | 16 | 120 | 84 | 6.1 | no | X |

*: Adhesive layer is 500 μm thick

TABLE 3

(Frame having a side of 5 inches.)

| Condition | Hard adhesive layer | | Soft adhesive layer | | One month after stuck | | Overall evaluation |
|---|---|---|---|---|---|---|---|
| | Hardness (gf) | Thickness (%) | Hardness (gf) | Thickness (%) | Flatness (μm) | Deformation of adhesive | |
| ① | 150 | 14 | 60 | 86 | 1.9 | yes | X |
| ② | 170 | 13 | ↓ | 87 | 0.9 | no | ○ |
| ③ | 220 | 31 | ↓ | 69 | 2.2 | no | X |
| ④ | ↓ | 24 | ↓ | 76 | 1.1 | no | ○ |
| ⑤ | ↓ | 17 | ↓ | 83 | 0.6 | no | ○ |
| ⑥ | ↓ | 6 | ↓ | 94 | 1.0 | no | ○ |
| ⑦ | ↓ | 4 | ↓ | 96 | 2.1 | yes | X |
| ⑧ | 240 | 15 | ↓ | 85 | 1.4 | no | ○ |
| ⑨ | 220 | 18 | 40 | 82 | 1.3 | no | ○ |
| ⑩ | ↓ | 16 | 100 | 84 | 1.3 | no | ○ |
| ⑪ | ↓ | 15 | 120 | 85 | 2.2 | no | X |

*: Adhesive layer is 500 μm thick

TABLE 4

(Frame having a side of 6 inches.)

| Condition | Hard adhesive layer | | Soft adhesive layer | | One month after stuck | | Overall evaluation |
|---|---|---|---|---|---|---|---|
| | Hardness (gf) | Thickness (%) | Hardness (gf) | Thickness (%) | Flatness (μm) | Deformation of adhesive | |
| ① | 150 | 14 | 60 | 86 | 5.1 | yes | X |
| ② | 170 | 12 | ↓ | 88 | 4.2 | no | ○ |
| ③ | 220 | 34 | ↓ | 66 | 6.2 | no | X |
| ④ | ↓ | 23 | ↓ | 77 | 4.0 | no | ○ |
| ⑤ | ↓ | 15 | ↓ | 85 | 3.2 | no | ○ |
| ⑥ | ↓ | 6 | ↓ | 94 | 3.9 | no | ○ |
| ⑦ | ↓ | 2 | ↓ | 98 | 5.8 | yes | X |
| ⑧ | 240 | 17 | ↓ | 83 | 3.6 | no | ○ |
| ⑨ | 220 | 15 | 40 | 85 | 3.8 | no | ○ |
| ⑩ | ↓ | 14 | 100 | 86 | 4.4 | no | ○ |
| ⑪ | ↓ | 13 | 120 | 87 | 6.1 | no | X |

*: Adhesive layer is 500 μm thick

TABLE 5

(Frame having a side of 5 inches.)

| Condition | Hard adhesive layer | | Soft adhesive layer | | One month after stuck | | Overall evaluation |
|---|---|---|---|---|---|---|---|
| | Hardness (gf) | Thickness (%) | Hardness (Gf) | Thickness (%) | Flatness (μm) | Deformation of adhesive | |
| ① | 150 | 21 | 60 | 79 | 2.1 | yes | X |
| ② | 170 | 20 | ↓ | 80 | 1.2 | no | ○ |

TABLE 5-continued (Frame having a side of 5 inches.)

| Condition | Hard adhesive layer | | Soft adhesive layer | | One month after stuck | | Overall |
|---|---|---|---|---|---|---|---|
| | Hardness (gf) | Thickness (%) | Hardness (Gf) | Thickness (%) | Flatness (μm) | Deformation of adhesive | evaluation |
| ③ | 220 | 43 | ↓ | 57 | 2.6 | no | X |
| ④ | ↓ | 29 | ↓ | 71 | 1.3 | no | ○ |
| ⑤ | ↓ | 18 | ↓ | 72 | 0.8 | no | ○ |
| ⑥ | ↓ | 12 | ↓ | 88 | 1.2 | no | ○ |
| ⑦ | ↓ | 4 | ↓ | 96 | 2.7 | yes | X |
| ⑧ | 240 | 20 | ↓ | 80 | 1.4 | no | ○ |
| ⑨ | 220 | 22 | 40 | 78 | 1.3 | no | ○ |
| ⑩ | ↓ | 21 | 100 | 79 | 1.5 | no | ○ |
| ⑪ | ↓ | 19 | 120 | 81 | 2.6 | no | X |

*: Adhesive layer is 1600 μm wide

TABLE 6

(Frame having a side of 6 inches.)

| Condition | Hard adhesive layer | | Soft adhesive layer | | One month after stuck | | Overall |
|---|---|---|---|---|---|---|---|
| | Hardness (gf) | Thickness (%) | Hardness (Gf) | Thickness (%) | Flatness (μm) | Deformation of adhesive | evaluation |
| ① | 150 | 18 | 60 | 82 | 4.9 | yes | X |
| ② | 170 | 21 | ↓ | 79 | 4.4 | no | ○ |
| ③ | 220 | 43 | ↓ | 57 | 6.8 | no | X |
| ④ | ↓ | 28 | ↓ | 72 | 4.2 | no | ○ |
| ⑤ | ↓ | 21 | ↓ | 79 | 3.5 | no | ○ |
| ⑥ | ↓ | 9 | ↓ | 91 | 4.1 | no | ○ |
| ⑦ | ↓ | 3 | ↓ | 97 | 5.6 | yes | X |
| ⑧ | 240 | 20 | ↓ | 80 | 4.0 | no | ○ |
| ⑨ | 220 | 21 | 40 | 79 | 3.9 | no | ○ |
| ⑩ | ↓ | 19 | 100 | 81 | 4.5 | no | ○ |
| ⑪ | ↓ | 18 | 120 | 82 | 6.5 | no | X |

*: Adhesive layer is 1600 μm wide

TABLE 7

(Frame having a side of 5 inches.)

| Condition | Hard adhesive layer | | Soft adhesive layer | | One month after stuck | | Overall |
|---|---|---|---|---|---|---|---|
| | Hardness (gf) | Thickness (%) | Hardness (Gf) | Thickness (%) | Flatness (μm) | Deformation of adhesive | evaluation |
| ① | 150 | 20 | 60 | 80 | 1.9 | yes | X |
| ② | 170 | 21 | ↓ | 79 | 1.5 | no | ○ |
| ③ | 220 | 42 | ↓ | 58 | 2.9 | no | X |
| ④ | ↓ | 28 | ↓ | 72 | 1.4 | no | ○ |
| ⑤ | ↓ | 23 | ↓ | 77 | 0.9 | no | ○ |
| ⑥ | ↓ | 12 | ↓ | 88 | 1.6 | no | ○ |
| ⑦ | ↓ | 4 | ↓ | 96 | 3.0 | yes | X |
| ⑧ | 240 | 23 | ↓ | 77 | 1.7 | no | ○ |
| ⑨ | 220 | 20 | 40 | 80 | 1.5 | no | ○ |
| ⑩ | ↓ | 19 | 100 | 81 | 1.6 | no | ○ |
| ⑪ | ↓ | 19 | 120 | 81 | 2.9 | no | X |

*: Adhesive layer is 1600 μm wide

TABLE 8

(Frame having a side of 6 inches.)

| Condition | Hard adhesive layer | | Soft adhesive layer | | One month after stuck | | Overall |
|---|---|---|---|---|---|---|---|
| | Hardness (gf) | Thickness (%) | Hardness (Gf) | Thickness (%) | Flatness (μm) | Deformation of adhesive | evaluation |
| ① | 150 | 19 | 60 | 81 | 5.1 | yes | X |
| ② | 170 | 20 | ↓ | 80 | 4.6 | no | ○ |
| ③ | 220 | 43 | ↓ | 57 | 7.8 | no | X |
| ④ | ↓ | 28 | ↓ | 72 | 4.4 | no | ○ |

TABLE 8-continued (Frame having a side of 6 inches.)

| | Hard adhesive layer | | Soft adhesive layer | | One month after stuck | | Overall |
|---|---|---|---|---|---|---|---|
| Condition | Hardness (gf) | Thickness (%) | Hardness (Gf) | Thickness (%) | Flatness (μm) | Deformation of adhesive | evaluation |
| ⑤ | ↓ | 20 | ↓ | 80 | 3.7 | no | ○ |
| ⑥ | ↓ | 13 | ↓ | 87 | 4.3 | no | ○ |
| ⑦ | ↓ | 5 | ↓ | 95 | 6.1 | yes | X |
| ⑧ | 240 | 20 | ↓ | 80 | 4.1 | no | ○ |
| ⑨ | 220 | 21 | 40 | 79 | 4.3 | no | ○ |
| ⑩ | ↓ | 23 | 100 | 77 | 4.4 | no | ○ |
| ⑪ | ↓ | 21 | 120 | 79 | 6.5 | no | X |

*: Adhesive layer is 1600 μm wide

In the pellicle of the present invention, the mask-adhering layer for mounting the pellicle on the mask is formed of a combination of a hard resin layer and a soft resin layer, the hard resin having a hardness of not smaller than 170 gf and the soft resin having a hardness of not larger than 100 gf. In mounting the pellicle on the mask or in peeling the pellicle off the mask, therefore, the mask is not damaged and the adhesive does not remain on the mask. Besides, the mask maintains flatness even when the surfaces of the mask and of the pellicle film are held not only in the horizontal direction but also in the vertical direction.

What is claimed is:

1. A pellicle comprising a pellicle film, a pellicle frame supporting the pellicle film, and an adhesive resin layer provided on the surface of the pellicle frame on the side opposite to the surface supporting the pellicle film, wherein said adhesive resin layer is formed of a combination of a hard resin layer and a soft resin layer.

2. A pellicle according to claim 1, wherein said hard resin has a hardness (JIS A) of not smaller than 170 gf and said soft resin has a hardness (JIS A) of not larger than 100 gf.

3. A pellicle according to claim 1, wherein said soft resin layer is formed maintaining a thickness larger than that of said hard resin layer.

4. A pellicle according to claim 3, wherein said adhesive resin layer has such a layer structure that said soft resin layer is located on the side of the pellicle frame and said hard resin layer is located on said soft resin layer, and the pellicle frame is mounted on a mask via said hard resin layer.

5. A pellicle according to claim 4, wherein said hard resin layer has a thickness which is from 5 to 30% of the thickness of the adhesive resin layer, and said soft resin layer has a thickness which is from 95 to 70% of the thickness of the adhesive resin layer.

6. A pellicle according to claim 1, wherein said adhesive resin layer is so provided that both said soft resin layer and said hard resin layer come in contact with the pellicle frame and are mounted on a mask.

7. A pellicle according to claim 6, wherein said hard resin layer is disposed under said soft resin layer.

8. A pellicle according to claim 6, wherein said soft resin layer is disposed between said two hard resin layers.

9. A pellicle according to claim 6, wherein the width of contact between said hard resin layer and the mask that is mounted, is from 10 to 30% of the width of contact between said adhesive resin layer and the mask that is mounted.

* * * * *